US008971551B2

(12) United States Patent
Ekstrand

(10) Patent No.: US 8,971,551 B2
(45) Date of Patent: Mar. 3, 2015

(54) VIRTUAL BASS SYNTHESIS USING HARMONIC TRANSPOSITION

(71) Applicant: Dolby International AB, Amsterdam, Zuidoost (NL)

(72) Inventor: Per Ekstrand, Saltsjobaden (SE)

(73) Assignee: Dolby International AB, Amsterdam (NL)

( * ) Notice: Subject to any disclaimer, the term of this patent is extended or adjusted under 35 U.S.C. 154(b) by 339 days.

(21) Appl. No.: 13/652,023

(22) Filed: Oct. 15, 2012

(65) Prior Publication Data

US 2013/0044896 A1 Feb. 21, 2013

Related U.S. Application Data

(63) Continuation-in-part of application No. 12/881,821, filed on Sep. 14, 2010, and a continuation-in-part of application No. 13/321,910, filed as application No. PCT/EP2010/057176 on May 25, 2010, application No. 13/652,023, which is a continuation-in-part of application No. 13/499,893, filed as application No. PCT/EP2010/057156 on Apr. 20, 2012, now Pat. No. 8,886,346.

(60) Provisional application No. 61/243,624, filed on Sep. 18, 2009, provisional application No. 61/181,364, filed on May 27, 2009, provisional application No. 61/312,107, filed on Mar. 9, 2010, provisional application No. 61/253,775, filed on Oct. 21, 2009, provisional application No. 61/330,786, filed on May 3, 2010.

(51) Int. Cl.
*H03G 5/00* (2006.01)

(52) U.S. Cl.
USPC .............................................. 381/98; 381/61

(58) Field of Classification Search
None
See application file for complete search history.

(56) References Cited

U.S. PATENT DOCUMENTS

| | | | | |
|---|---|---|---|---|
| 5,930,373 | A | 7/1999 | Shashoua et al. | 381/98 |
| 6,134,330 | A | 10/2000 | De Poortere et al. | 381/61 |
| 6,285,767 | B1 | 9/2001 | Klayman | 381/17 |

(Continued)

OTHER PUBLICATIONS

Hao Mu, et al., "A Psychoacoustic Bass Enhancement System with Improved Transient and Steady-State Performance," IEEE International Conference on Acoustics, Speech and Signal Processing, Mar. 25-30, 2012, pp. 141-144.

(Continued)

*Primary Examiner* — Paul Huber

(57) ABSTRACT

In some embodiments, a virtual bass generation method including steps of: performing harmonic transposition on low frequency components of an input audio signal (typically, bass frequency components expected to be inaudible during playback of the input audio signal using an expected speaker or speaker set) to generate transposed data indicative of harmonics (which are expected to be audible during playback, using the expected speaker(s), of an enhanced version of the input audio which includes the harmonics); generating an enhancement signal in response to the transposed data; and generating an enhanced audio signal by combining (e.g., mixing) the enhancement signal with the input audio signal. Other aspects are systems (e.g., programmed processors) and devices (e.g., devices having physically-limited bass reproduction capabilities, such as, for example, a notebook, tablet, mobile phone, or other device with small speakers) configured to perform any embodiment of the method.

36 Claims, 4 Drawing Sheets

(56) References Cited

U.S. PATENT DOCUMENTS

| | | | | |
|---|---|---|---|---|
| 7,242,710 | B2 | 7/2007 | Ekstrand et al. | 375/232 |
| 7,283,955 | B2 | 10/2007 | Liljeryd et al. | 704/219 |
| 2007/0253576 | A1 | 11/2007 | Bai et al. | 381/98 |
| 2010/0054482 | A1 * | 3/2010 | Johnston | 381/17 |
| 2010/0232624 | A1 | 9/2010 | Zhang | 381/103 |
| 2011/0004479 | A1 | 1/2011 | Ekstrand et al. | 704/500 |
| 2011/0091048 | A1 | 4/2011 | Bai et al. | 381/93 |
| 2012/0008788 | A1 | 1/2012 | Jonsson et al. | 381/17 |
| 2012/0065983 | A1 | 3/2012 | Ekstrand et al. | 704/500 |
| 2012/0195442 | A1 | 8/2012 | Villemoes et al. | 381/98 |

OTHER PUBLICATIONS

Villemoes, et al., "Methods for Enhanced Harmonic Transposition," 2011 IEEE Workshop on Applications of Signal Processing to Audio and Acoustics, Oct. 16-19, 2011, 4 pages.

Bai, et al., "Synthesis and Implementation of Virtual Bass System with a Phase-Vocoder Approach," J. Audio Eng. Soc., vol. 54, No. 11, Nov. 2006, pp. 1077-1091.

Florencio, "On the Use of Asymmetric Windows for Reducing the Time Delay in Real-Time Spectral Analysis," Speech Processing 1, Toronto, May 14-17, 1991 [International Conference on Acoustics, Speech & Signal Processing, New York, IEEE, vol. Conf. 16, Apr. 14, 1991], pp. 3261-3264.

Dhabal, et al., "An Efficient Quadrature Mirror Filter Design and its Applications in Audio Signal Processing," 2011 International Conference on Communication and Industrial Application, IEEE, Dec. 26, 2011, 4pp.

European Search Report mailed on Feb. 20, 2014 in European Patent Application 13188415.7, 8 pages.

* cited by examiner (Harmonic Transposition Illustrated in Frequency Domain)

VIRTUAL BASS SYNTHESIS USING HARMONIC TRANSPOSITION

CROSS-REFERENCE TO RELATED APPLICATIONS

The present application is a continuation-in-part of, and claims the benefit of the filing date of each of the following pending US Patent Applications: U.S. patent application Ser. No. 12/881,821, filed Sep. 14, 2010, entitled "Harmonic Transposition," by Per Ekstrand and Lars Villemoes, which claims the benefit of the filing date of U.S. Provisional Patent Application No. 61/243,624, filed Sep. 18, 2009, entitled "Harmonic Transposition," by Per Ekstrand and Lars Villemoes; U.S. patent application Ser. No. 13/321,910, filed May 25, 2010 (International Filing Date), entitled "Efficient Combined Harmonic Transposition," by Per Ekstrand, Lars Villemoes, and Per Hedelin, which claims the benefit of the filing date of each of U.S. Provisional Patent Application No. 61/181,364, filed May 27, 2009, entitled "Efficient Combined Harmonic Transposition," by Per Ekstrand, Lars Villemoes, and Per Hedelin, and U.S. Provisional Patent Application No. 61/312,107, filed Mar. 9, 2010, entitled "Efficient Combined Harmonic Transposition," by Per Ekstrand, Lars Villemoes, and Per Hedelin; and U.S. patent application Ser. No. 13/499,893, filed May 20, 2010 (International Filing Date), entitled "Oversampling in a Combined Transposer Filter Bank," by Lars Villemoes and Per Ekstrand, which claims the benefit of the filing date of each of U.S. Provisional Patent Application No. 61/253,775, filed Oct. 21, 2009, entitled "Oversampling in a Combined Transposer Filter Bank," by Lars Villemoes and Per Ekstrand, and U.S. Provisional Patent Application No. 61/330,786, filed May 3, 2010, entitled "Oversampling in a Combined Transposer Filter Bank," by Lars Villemoes and Per Ekstrand.

TECHNICAL FIELD

The invention relates to methods and systems for virtual bass synthesis. Typical embodiments employ harmonic transposition to generate an enhancement signal which is combined with an audio signal to generate an enhanced audio signal, such that the enhanced audio signal provides an increased perceived level of bass content during playback by one or more loudspeakers that cannot physically reproduce bass frequencies of the audio signal or the enhanced audio signal.

BACKGROUND OF THE INVENTION

Bass synthesis is the collective name for a class of techniques that add in components to the low frequency range of an audio signal in order to enhance the bass that is perceived during playback of the enhanced signal. Some such techniques (sometimes referred to as sub bass synthesis methods) create low frequency components below the signal's existing frequency components in order to extend and improve the lowest frequency range. Other techniques in the class, known as "virtual pitch" algorithms, generate audible harmonics from an inaudible bass range (e.g., a bass range that is inaudible when the signal is rendered by small loudspeakers), so that the generated harmonics improve the perceived bass response. Virtual pitch methods typically exploit the well known "missing fundamental" phenomenon, in which low pitches (one or more low frequency fundamentals, and lower harmonics of each fundamental) can sometimes be inferred by a human auditory system from upper harmonics of the low frequency fundamental(s), when the fundamental(s) and lower harmonics (e.g., the first harmonic of each fundamental) themselves are missing.

Some virtual pitch methods are designed to increase the perceived level of bass content of an audio signal during playback of the signal by one or more loudspeakers (e.g., small loudspeakers) that cannot physically reproduce bass frequencies of the audio signal. Such methods typically include steps of analyzing the bass frequencies present in input audio and enhancing the input audio by generating (and including in the enhanced audio) audible harmonics that aid the perception of lower frequencies that are missing during playback of the enhanced audio (e.g., playback by small loudspeakers that cannot physically reproduce the missing lower frequencies). Such methods perform harmonic transposition of frequency components of the input audio that are expected to be inaudible during playback of the input audio (i.e., having frequencies too low to be audible during playback on the expected speaker(s)), to generate audible higher frequency components (i.e., having frequencies that are sufficiently high to be audible during playback on the expected speaker(s)). For example, FIG. 1 shows the frequency-amplitude spectrum of an audio signal, having an inaudible range 100 of frequency components, and an audible range of frequency components above the inaudible range. Harmonic transposition of frequency components in the inaudible range 100 can generate transposed frequency components in portion 101 of the audible range, which can enhance the perceived level of bass content of the audio signal during playback. Such harmonic transposition may include application of multiple transposition factors to each relevant frequency component of the input audio, to generate multiple harmonics of the component.

BRIEF DESCRIPTION OF THE INVENTION

Typical embodiments of the inventive method (sometimes referred to herein as "virtual bass" synthesis or generation methods) are designed to increase the perceived level of bass content of an audio signal during playback of the signal by one or more loudspeakers (e.g., small loudspeakers) that cannot physically reproduce bass frequencies of the audio signal. Typical embodiments include steps of: applying harmonic transposition to bass frequencies present in the input audio signal (but expected to be inaudible during playback of the input audio signal using an expected speaker or speaker set) to generate harmonics that are expected to be audible during playback of the enhanced audio signal using the expected speaker(s), and generating enhanced audio (an enhanced version of the input audio) by including the harmonics in the enhanced audio. This may aid the perception of lower frequencies that are missing during playback of the enhanced audio (e.g., playback by small loudspeakers that cannot physically reproduce the missing lower frequencies). The method typically includes steps of performing a time-to-frequency domain transform (e.g., an FFT) on the input audio to generate frequency components indicative of bass content of the input audio, and enhancing the input audio by generating (and including in an enhanced version of the input audio) audible harmonics of these frequency components that aid the perception of lower frequencies that are expected to be missing during playback of the enhanced audio (e.g., by small loudspeakers that cannot physically reproduce the missing lower frequencies).

In a class of embodiments, the invention is a virtual bass generation method, including steps of: (a) performing harmonic transposition on low frequency components of an input audio signal (typically, bass frequency components expected to be inaudible during playback of the input audio signal using an expected speaker or speaker set) to generate transposed data indicative of harmonics (which are expected to be audible during playback, using the expected speaker(s), of an enhanced version of the input audio which includes the harmonics); (b) generating an enhancement signal in response to the transposed data (e.g., such that the enhancement signal is indicative of the harmonics or amplitude modified (e.g., scaled) versions of the harmonics); and (c) generating an enhanced audio signal by combining (e.g., mixing) the enhancement signal with the input audio signal. Typically, the enhanced audio signal provides an increased perceived level of bass content during playback of the enhanced audio signal by one or more loudspeakers that cannot physically reproduce the low frequency components. Typically, combining the enhancement signal with the input audio signal aids the perception of low frequencies that are missing during playback of the enhanced audio signal (e.g., playback by small loudspeakers that cannot physically reproduce the missing low frequencies).

The harmonic transposition performed in step (a) employs combined transposition to generate harmonics, by means of a second order ("base") transposer and at least one higher order transposer (typically, a third order transposer and a fourth order transposer, and optionally also at least one transposer of order higher than four), of each of the low frequency components, such that all of the harmonics (and typically also the transposed data) are generated in response to frequency-domain values determined by a single, common time-to-frequency domain transform stage (e.g., by performing phase multiplication on frequency coefficients resulting from a single time-to-frequency domain transform), and a single, common frequency-to-time domain transform is subsequently performed. Typically, the harmonic transposition is performed using integer transposition factors, which eliminates the need for unstable (or inexact) phase estimation, phase unwrapping and/or phase locking techniques (e.g., as implemented in conventional phase vocoders).

Typically, step (a) is performed on low frequency components of the input audio signal which have been generated by performing a frequency domain oversampled transform on the input audio signal, by generating windowed, zero-padded samples, and performing a time-to-frequency domain transform on the windowed, zero-padded samples. The frequency domain oversampling typically improves the quality of the virtual bass generation in response to impulse-like (transient) signals.

Typically, the method includes a preprocessing step on the input audio signal to generate critically sampled audio indicative of the low frequency components, and step (a) is performed on the critically sampled audio. In some embodiments, the input audio signal is a sub-banded, complex-valued QMF domain (CQMF) signal, and the critically sampled audio is indicative of content of a set of low frequency sub-bands of the CQMF signal. Typically, the input audio signal is indicative of low frequency audio content (in a range from 0 to B Hz, where B is a number less than 500), and the critically sampled audio is an at least substantially critically sampled (critically sampled or close to critically sampled) signal indicative of the low frequency audio content, and has sampling frequency Fs/Q, where Fs is the sampling frequency of the input audio signal, and Q is a downsampling factor. Preferably, Q is the largest factor which makes Fs/Q at least substantially equal to (but not less than) two times the bandwidth B of the input signal (i.e., Q≤Fs/2B).

In some embodiments, step (a) is performed in a subsampled (downsampled) domain, which is the first (lowest frequency) band (channel 0) of a CQMF bank for the transposer analysis stage (input), and the first two (lowest frequency) bands (channels 0 and 1) of a CQMF bank for the transposer synthesis stage (output). In some such embodiments, the separation of CQMF channels 0 and 1 is accomplished by a splitting of processed frequency coefficients (i.e., frequency coefficients formerly processed by non-linear processing stages 9-11 and energy adjusting stages 13-15 of FIG. 2) into a first set of frequency components in a first frequency band (e.g., the frequency band of CQMF channel 0), and a second set of frequency components in a second frequency band (e.g., the frequency band of CQMF channel 1), and performing a relatively small size frequency-to-time domain transform on each of the first set of frequency components and the second set of frequency components (rather than a single, relatively large size transform on all of the transposed data). Preferably, the first set of frequency components and the second set of frequency components are magnitude compensated to account for the CQMF channel 0 and CQMF channel 1 frequency responses. Typically, the magnitude compensations are applied to the frequency components indicative of the overlapping regions between CQMF channel 0 and CQMF channel 1 (e.g., for the frequency components of CQMF channel 0 indicative of the middle of the pass band and upwards in frequency, and for the frequency components of CQMF channel 1 indicative of the middle of the pass band and downwards in frequency).

In some embodiments, the transposed data are energy adjusted (e.g., attenuated). For example, the transposed data may be attenuated in a manner determined by the well-known Equal Loudness Contours (ELCs) or an approximation thereof. For another example, the transposed data indicative of each generated harmonic overtone spectrum may have an additional attenuation (e.g., a slope gain in dB per octave) applied thereto. The attenuation may depend on a tonality metric (e.g., for the frequency range of the low frequency components of the input audio signal), e.g., so that a strong tonality results in a larger attenuation (in dB per octave) within the spectrum of each generated harmonic overtone.

In some embodiments, data indicative of the harmonics are energy adjusted (e.g., attenuated) in accordance with a control function which determines a gain to be applied to each hybrid sub-band of the transposed data (where a hybrid sub-band may constitute a frequency band division of the audio data, indicative of a frequency resolution somewhere in-between the resolution provided by the time-to-frequency domain transform of the "base" transposer and the bandwidth of the sub-banded input signal respectively). The control function may determine the gain, g(b), to be applied to the transposed data in a hybrid sub-band b, and may have the following form:

$$g(b)=H[(G\cdot nrg_{orig}(b)-nrg_{vb}(b))/(G\cdot nrg_{orig}(b)+nrg_{vb}(b))]+B,$$

where H, G and B are constants, and $nrg_{orig}(b)$ and $nrg_{vb}(b)$ are the energies (e.g., averaged energies) in the corresponding hybrid sub-band of the input audio signal and the transposed data (or the enhancement signal generated in step (b)), respectively.

Another aspect of the invention is a system (e.g., a device having physically-limited or otherwise limited bass reproduction capabilities, such as, for example, a notebook, tablet, mobile phone, or other device with small speakers) configured to perform any embodiment of the inventive method on an input audio signal.

In a class of embodiments, the invention is an audio playback system which has limited (e.g., physically-limited) bass reproduction capabilities (e.g., a notebook, tablet, mobile phone, or other device with small speakers), and is configured to perform virtual bass generation on audio (in accordance with an embodiment of the inventive method) to generate enhanced audio, and to playback the enhanced audio. Typically, the virtual bass generation is performed such that playback of the enhanced audio by the system provides the perception of enhanced bass response (relative to the bass response perceived during playback of the non-enhanced input audio by the device), including by synthesizing audible harmonics of frequencies (of the input audio) which are below the system's low-frequency roll-off (e.g., below approximately 100-300 Hz). Typically, the bass perceived during playback of the enhanced audio using headphones or full-range loudspeakers is also increased.

In another class of embodiments, the invention is a method for performing harmonic transposition of inaudible signal components of input audio (components having frequencies too low to be audible during playback by an expected speaker or set of speakers), to generate enhanced audio including audible harmonics of the inaudible components (i.e., harmonics having frequencies that are audible during playback on the expected speaker or set of speakers), including by application of plural transposition factors (to produce the audible harmonics) followed by energy adjustment. Other aspects of the invention are systems and devices configured to perform such harmonic transposition.

For a missing fundamental to be perceived, the upper (audible) harmonics thereof that are included in an enhanced audio signal (generated in accordance with the invention) typically must constitute an at least substantially complete (but truncated) harmonic series. However, typical embodiments of the invention transpose all frequency components in a predetermined source range and these components might themselves be harmonics of unknown order. Thus, in some cases a missing fundamental itself may not be perceived when the enhanced audio is rendered. Nevertheless the sensation of bass will be typically recognized because a source (e.g., a musical instrument) generating a bass signal will be perceived as being present in the enhanced audio although at a higher pitch (e.g., at the first harmonic of the fundamental).

In a class of embodiments, the inventive system comprises a preprocessing stage (e.g., a summation stage) coupled to receive input audio indicative of low frequency audio content (in a range from 0 to B Hz, so that B is the bandwidth of the low frequency audio content) and configured to generate critically sampled audio indicative of the low frequency audio content; a bass enhancement stage (including a harmonic transposer) coupled and configured to generate a bass enhancement signal in response to the critically sampled audio; and a bass enhanced audio generation stage coupled and configured to generate to a bass enhanced audio signal by combining (e.g., mixing) the bass enhancement signal and the input audio. The preprocessing stage is preferably configured to provide an at least substantially critically sampled (critically sampled or close to critically sampled) signal to the bass enhancement stage. The at least substantially critically sampled signal is indicative of the low frequency audio content (in the range from 0 to B Hz), and has sampling frequency Fs/Q, where Fs is the sampling frequency of the input audio, and Q is a downsampling factor. Preferably, Q is the largest factor which makes Fs/Q at least substantially equal to (but not less than) two times the bandwidth B of the input signal (i.e., $Q \leq Fs/2B$). Transposed frequency components (produced in the bass enhancement stage) may have a sampling frequency of (Fs*S)/Q, where S is an integer. The downsampling factor Q preferably forces the output signal of the summation stage to be critically sampled or close to critically sampled.

In some embodiments, the inventive system is or includes a general or special purpose processor programmed with software (or firmware) and/or otherwise configured to perform an embodiment of the inventive method. In some embodiments, the inventive system is a general purpose processor, coupled to receive input audio data, and programmed (with appropriate software) to generate output audio data by performing an embodiment of the inventive method. In some embodiments, the inventive system is a digital signal processor, coupled to receive input audio data, and configured (e.g., programmed) to generate output audio data in response to the input audio data by performing an embodiment of the inventive method.

Aspects of the invention include a system configured (e.g., programmed) to perform any embodiment of the inventive method, and a computer readable medium (e.g., a disc) which stores code for implementing any embodiment of the inventive method.

NOTATION AND NOMENCLATURE

Figure 1:
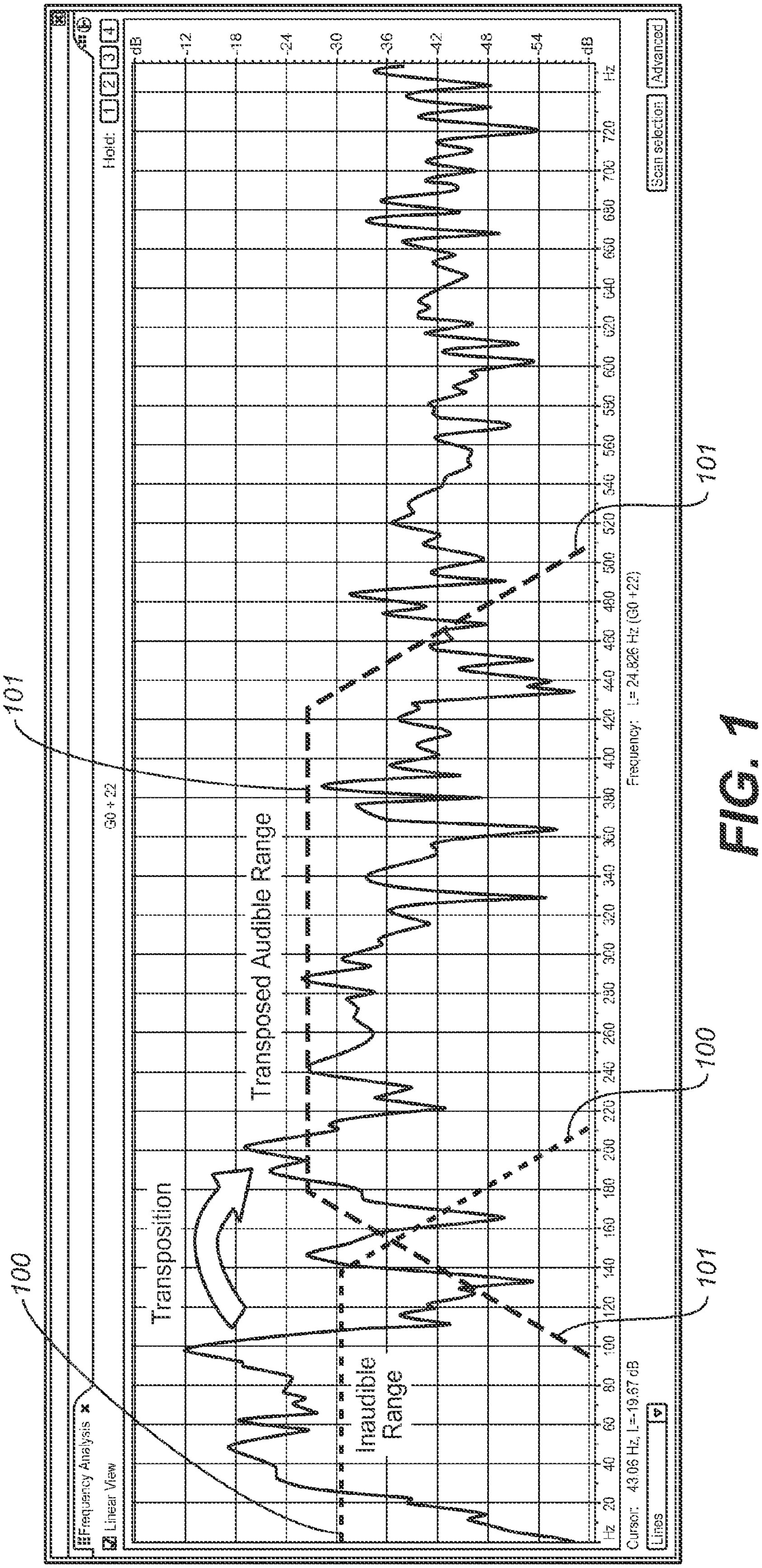
FIG. 1 is a graph of the frequency-amplitude spectrum of an audio signal, having an inaudible range 100 of frequency components, and an audible range of frequency components above the inaudible range. Harmonic transposition of frequency components in the inaudible range can generate transposed frequency components in portion 101 of the audible range.

Throughout this disclosure, including in the claims, the expression performing an operation "on" a signal or data (e.g., filtering, scaling, transforming, or applying gain to, the signal or data) is used in a broad sense to denote performing the operation directly on the signal or data, or on a processed version of the signal or data (e.g., on a version of the signal that has undergone preliminary filtering or pre-processing prior to performance of the operation thereon).

Throughout this disclosure including in the claims, the expression "system" is used in a broad sense to denote a device, system, or subsystem. For example, a subsystem that implements a decoder may be referred to as a decoder system, and a system including such a subsystem (e.g., a system that generates X output signals in response to multiple inputs, in which the subsystem generates M of the inputs and the other X-M inputs are received from an external source) may also be referred to as a decoder system.

Throughout this disclosure including in the claims, the term "processor" is used in a broad sense to denote a system or device programmable or otherwise configurable (e.g., with software or firmware) to perform operations on data (e.g., audio, or video or other image data). Examples of processors include a field-programmable gate array (or other configurable integrated circuit or chip set), a digital signal processor programmed and/or otherwise configured to perform pipelined processing on audio or other sound data, a programmable general purpose processor or computer, and a programmable microprocessor chip or chip set.

Throughout this disclosure including in the claims, the term "couples" or "coupled" is used to mean either a direct or indirect connection. Thus, if a first device couples to a second device, that connection may be through a direct connection, or through an indirect connection via other devices and connections.

DETAILED DESCRIPTION OF THE PREFERRED EMBODIMENTS

Many embodiments of the present invention are technologically possible. It will be apparent to those of ordinary skill in the art from the present disclosure how to implement them. Embodiments of the inventive system, method, and medium will be described with reference to FIGS. 2, 3, 4, and 5.

In a class of embodiments, the inventive virtual bass synthesis method implements the following basic features:

harmonic transposition (sometimes referred to as "harmonic generation") employing an interpolation technique (sometimes referred to herein as "combined transposition") to generate second order ("base"), third order, fourth order, and sometimes also higher order harmonics (i.e., harmonics having transposition factors of 2, 3, and 4, and sometimes also 5 or more) of a low frequency component of input audio, with the third order and fourth order (and any higher order) harmonics being generated by means of interpolation in a common analysis and synthesis filter bank (or transform) stage, e.g., using the same analysis/synthesis chain employed to generate the second order ("base") harmonic of the low frequency component. This saves computational complexity. Otherwise, one or both of a forward (time-to-frequency domain) transform or inverse (frequency-to-time domain) transform utilized to perform the harmonic transposition would need to be of different sizes for the processing to implement the different transposition factors. However, such reduction in computational complexity typically comes at the expense of somewhat reduced quality of the third and higher order harmonics;

oversampling in the frequency domain (i.e., zero-padded analysis and synthesis windows) to vastly improve the quality of playback of the output signal, when the input signal is indicative of transient (impulsive or percussive) sounds. This feature is of crucial importance to enhance the bass range of input audio (where said bass range is indicative of transient sound). Without frequency domain oversampling, output signals indicative of percussive sounds (e.g., drum sounds) would typically have pre-echoes and post-echoes, making the bass blurry and indistinct during playback. Oversampling in the frequency domain is typically implemented (e.g., in stage 3 of the FIG. 2 system) by generation of zero-padded analysis windows. Typically, this includes a step of padding the windowed input signal (e.g., the signal output from stage 3 of FIG. 2) with zeros, to allow a subsequent time-to-frequency domain transform (e.g., in stage 5 of the FIG. 2 system) to be performed with larger size blocks (and a step of performing the larger size transform is then performed, e.g., in stage 5 of FIG. 2). Typically, stage 5 implements a 128 point FFT, and each window (determined in stage 3) includes windowed versions of 64 samples of the CQMF channel 0 data, padded with 64 zeroes (32 zeroes padding each end of each window). Thus, padded, windowed blocks (each comprising 128 samples) are output from stage 3 (and are transformed in stage 5) at the same rate as 64 sample blocks of CQMF channel 0 data are input to stage 3. The zero-padding together with the larger size transform (where the transform size increase should be no less than a factor (T+1)/2, where T is the transposition factor (or "base" transposition factor in a combined transposer)) assures that the pre-echoes and post-echoes are suppressed for an isolated transient sound; and use of integer transposition factors, which eliminates the need for unstable (or inexact) phase estimation, phase unwrapping and/or phase locking techniques (e.g., as implemented in conventional phase vocoders). The transposed output signal (or "enhanced" signal) generated in accordance with typical embodiments of the invention is a time-stretched and frequency-shifted (pitch-shifted) version of the input signal. Relative to the input signal, the transposed output signal generated in accordance with typical embodiments of the invention has been stretched in time (by a factor S, wherein S is an integer, and S typically is the "base" transposition factor) and the transposed output signal includes transposed frequency components which have been shifted upwards in frequency (by the factors T/S, where T are the transposition factors). In digital systems, the time-stretched output can be interpreted as a signal having equal time duration compared to the input signal albeit having a factor of S higher sampling rate.

In a class of embodiments, the input data to be processed in accordance with the invention are sub-banded CQMF (complex-valued quadrature mirror filter) domain audio data.

In other embodiments, the CQMF data for the low frequency sub-band channels (typically the CQMF channels 0, 1 and 2), can undergo further frequency band splittings (e.g., in order to increase the frequency resolution for the low frequency range) by means of Nyquist filter banks of different sizes. Nyquist filter banks do not employ downsampling of the sub-band samples. Hence, the Nyquist filter banks have a particularly straightforward synthesis step, i.e. pure addition of the sub-band samples. In such systems, the combination of low frequency sub-band samples from the Nyquist analysis stages and the remaining CQMF channels (i.e., the CQMF channels that were not subjected to Nyquist filtering) are herein referred to as "hybrid" sub-band samples. In order to obtain a signal that is suitable as input data to be processed in accordance with the invention (e.g., a substantially critically sampled CQMF band), a number of the lowest hybrid sub-bands can be combined (e.g., added together).

Figure 2:
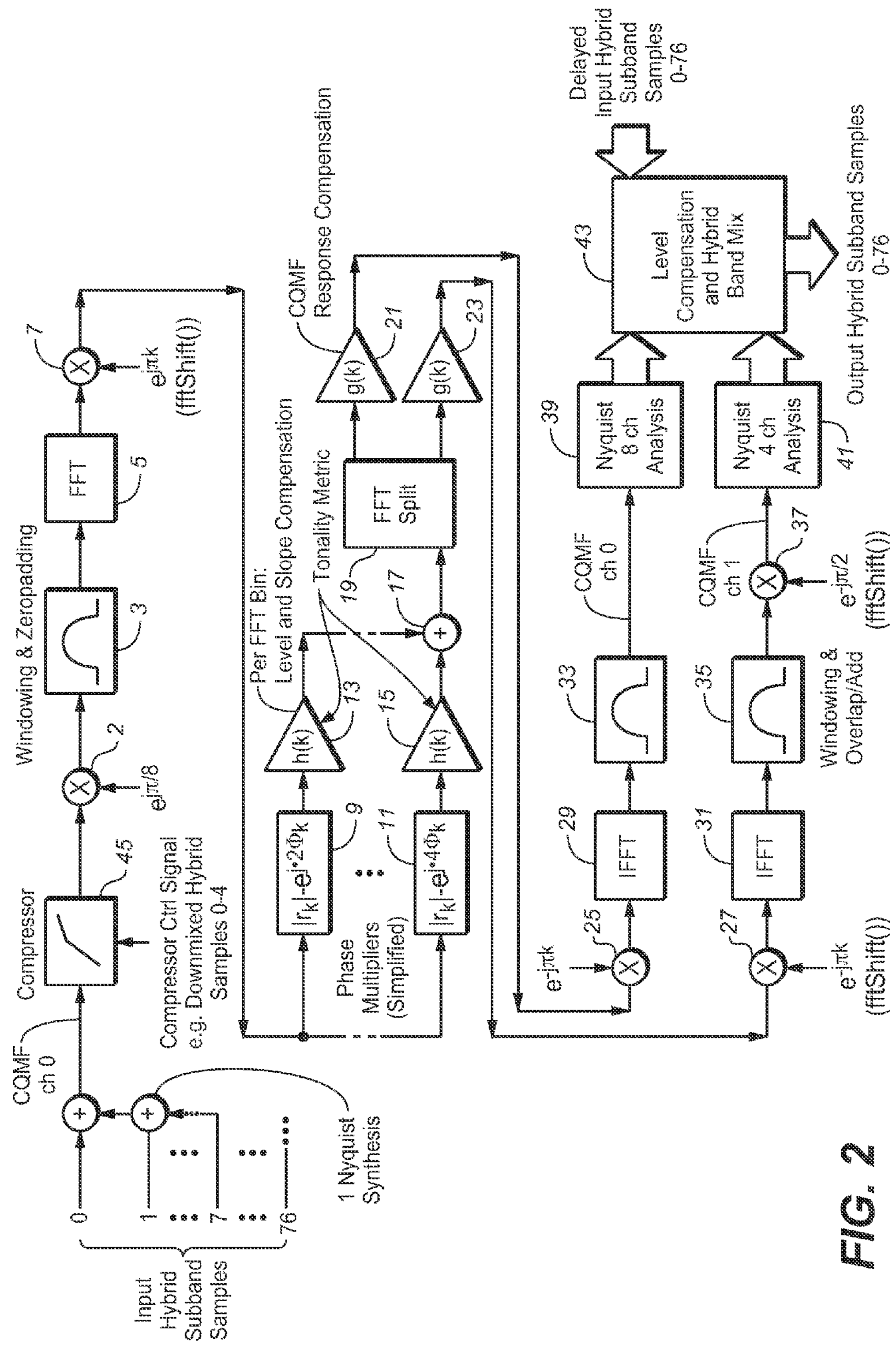
FIG. 2 is a block diagram of an embodiment of a system for performing virtual bass synthesis in accordance with an embodiment of the invention.

In typical embodiments, the lowest frequency hybrid sub-bands of the data (e.g., sub-bands 0-7, as shown in FIG. 2, where the sub-bands together span the range from 0-375 Hz) are combined (e.g., added together in Nyquist synthesis stage 1 of FIG. 2) to generate a conventional CQMF channel 0 signal (whose frequency content is in a band from 0-375 Hz). The latter signal is a low-pass filtered, complex-valued, time-domain audio signal (preferably, a critically sampled signal) whose pass band is 0 Hz to 375 Hz. In this context, "critical sampling" is used in a broader sense since the complex-valued nature of the sub-band samples inherently makes the sub-bands oversampled by at least a factor of 2. In these embodiments, the CQMF channel 0 signal undergoes optional compression (e.g., in stage 45 of the FIG. 2 system), windowing and zero-padding (e.g., in stage 3 of the FIG. 2 system), and then time-to-frequency domain transformation (e.g., in transform stage 5 of the FIG. 2 system). Although the transform stage typically implements an FFT (Fast Fourier Transform), in some embodiments the transform stage implements a time-to-frequency domain transform of another type (e.g., in variations on the FIG. 2 system, transform stage 5 implements a Fourier Transform, a Discrete Fourier Transform, or a Wavelet Transform, or another time-to-frequency domain transform or analysis filter bank which is not an FFT, and each of inverse transform stages 29 and 31 implements a corresponding inverse transform (a frequency-to-time domain transform) or synthesis filter bank.

U.S. Pat. No. 7,242,710, issued Jul. 10, 2007, to the inventor of the present invention, describes filter banks which can be employed to generate CQMF domain input data (of the type generated in stage 1 of the FIG. 2 embodiment of the present invention). Hybrid, sub-banded data (of the type input to stage 1 of FIG. 2) are commonly used for other purposes in typical audio encoders and audio post-processing systems, and thus are typically available without the need to generate them specially for processing in accordance with the present invention. An exemplary embodiment of the inventive system is a virtual bass synthesis module of an audio post-processing system.

A typical conventional harmonic transposer operates on a time domain signal having full sampling rate (44.1 kHz or 48 kHz), and employs an FFT (e.g., of size equal to roughly 1024 to 4096 lines) to generate (in the frequency domain) output audio indicative of frequency transposed samples of the input signal. Such a typical transposer also employs an inverse FFT to generate time domain output audio in response to the frequency domain output.

As a result of the synthesis of a single, critically sampled (or nearly critically sampled) channel (e.g., CQMF channel 0) in the FIG. 2 embodiment (and other typical embodiments of the invention) in response to the low frequency input data (e.g., the eight lowest frequency sub-bands of a set of hybrid, sub-banded input data), the samples of the single, critically sampled (or nearly critically sampled) channel (e.g., the complex-valued CQMG channel 0 samples) can be efficiently transformed into the frequency domain by an FFT transform of much smaller size (e.g., an FFT with block size of 32-256 samples) than the FFT transform (e.g., of block size equal to 1024 to 4096) that would be needed if the raw, unfiltered time-domain input data were transformed directly into the frequency domain.

Performing frequency transposition directly on the sub-bands of the hybrid data (the input to stage 1 of FIG. 2), and combining the resulting transposed data, is a suboptimal option. This is because, each of the low frequency hybrid sub-bands (shown as the input to stage 1 of FIG. 2) is over-sampled data, and if stage 1 of FIG. 2 were omitted, each of the low frequency hybrid sub-bands would be transformed into the frequency domain, so that the processing power required for each of the hybrid sub-bands would be as high as the processing power required for the single CQMF band (channel 0) in the FIG. 2 system.

When performing frequency transposition on a single CQMF band (e.g., channel 0), the inventive system preferably changes the phase response that would be needed if the transposition were performed directly on the CQMF sub-bands (frequency transposition in the CQMF domain is indeed possible. However, in the embodiments described herein it is assumed that the frequency resolution provided by the sub-band samples of the CQMF bank is inadequate for virtual bass processing in accordance with the invention). For example, this means that a low pass filtered symmetric Dirac pulse indicated by the sub-banded input data will remain symmetric when the CQMF domain version of the input data is passed through the CQMF based transposer. This phase response compensation is applied by element 2 of the FIG. 2 system. Moreover, the phase relations between the neighboring channels in a CQMF bank will not be correct when performing an FFT split (in element 19 of the FIG. 2 system). Therefore, a phase compensation factor needs to be applied (in element 37 of the FIG. 2 system).

The general CQMF analysis modulation may have the expression

The general CQMF analysis modulation may have the expression $$M(k,l)=e^{i\cdot\pi\cdot[(2\cdot k+1)\cdot(l-N/2-L/2)]/(2\cdot L)} \quad \text{(Eq. 1)},$$

where k denotes the CQMF channel number (which in turn corresponds to a frequency band), l denotes a time index, N denotes the prototype filter order (for symmetric prototype filters) or the system delay (for asymmetric prototype filters), and L denotes the number of CQMF channels. For a transposition of factor T (e.g., in stage 9 of the FIG. 2 system, with T=2), the analysis modulation should be $$M(k,l)=e^{i\cdot\pi\cdot[(2\cdot k+1)\cdot(l-N/2-L/(2\cdot T))]/(2\cdot L)} \quad \text{(Eq. 2)},$$

where the last term in the exponent compensates for the phase shift imposed by the transposer. Hence, for the FIG. 2 embodiment of the inventive system to implement transposition consistent with the expression in Eq. 2, it needs to multiply the first channel (k=0), which is also referred to herein as CQMF channel 0, by $$e^{i\cdot\pi\cdot(l-N/2-L/(2\cdot T)]/(2\cdot L)}/e^{i\cdot\pi\cdot(l-N/2-L/2)]/(2\cdot L)}=e^{i\pi/8} \quad \text{(Eq. 3)},$$

assuming that T=2. This multiplication, by $e^{i\pi/8}$, is implemented by element 2 of FIG. 2. Moreover, the constant phase shift between CQMF channels 0 and 1 is $$3\cdot\pi/(2\cdot L)\cdot(-L/2)-\pi/(2\cdot L)\cdot(-L/2)=-\pi/2. \quad \text{(Eq. 4)}$$

Hence CQMF channel 1 of the output (the signal output from stage 35 of FIG. 2) needs a multiplication by $e^{-i\pi/2}$ to preserve the phase relationship and emulate that it has passed a CQMF analysis stage. This multiplication is performed in element 37 of FIG. 2.

The input to a typical implementation of stage 1 of FIG. 2 are eight sub-band streams of samples, which are the lowest hybrid sub-band samples (resulting from an 8-channel Nyquist analysis filter bank) for each CQMF time slot. They have the same sampling frequency as the upper CQMF sub-band samples of the hybrid bands, which is typically 48000/64=750 Hz for an original input signal to the system of 48 kHz. The 8-channel Nyquist filter bank has pass-bands with center frequencies 47 Hz, 141 Hz, 234 Hz, 328 Hz, 422 Hz, 516 Hz, −141 Hz, and −47 Hz. The Nyquist filter bank uses complex-valued arithmetic and operates on complex-valued CQMF samples (channel 0) as input. The first 4 pass-bands (0-3) constitute the pass-band of CQMF channel 0, while the last 4 pass-bands filters the CQMF transition regions: channel 4 and 5 filters the overlap/transition region of CQMF channel 0 towards CQMF channel 1, and channel 6 and 7 filters the transition region to negative frequencies of CQMF channel 0. The output from the Nyquist filter bank is simply band-passed versions of the input CQMF signal. When stage 1 adds the eight streams of Nyquist samples back together (Nyquist synthesis), the result is an exact reconstruction of the CQMF channel 0, which is critically sampled in terms of sampling frequency (actually the CQMF bank may be oversampled by a factor of 2 due to the complex-valued sub-band samples, while the real part only of its output may be critically sampled (maximally decimated)).

The Nyquist synthesis step (implemented in a typical implementation of stage 1 of the FIG. 2 system) is particularly straightforward since it is just a simple summation of the samples from the 8 lowest hybrid channels of the sub-banded input data for each CQMF time slot. The summation generates a conventional CQMF channel 0 signal, which is input to element 2 of the FIG. 2 system (or to compressor 45, in implementations in which the optional compressor 45 is included in the FIG. 2 system). The output signals from the inventive transposer are two CQMF signals (the outputs of elements 33 and 35 of FIG. 2), containing the bass enhancement signal (sometime referred to as a virtual bass signal) to be mixed (in stage 43) with an appropriately delayed version of the original input signal. Both output signals are filtered through 8- and 4-channel Nyquist analysis stages (stages 39 and 41 of FIG. 2) respectively to convert them back to the original hybrid sub-banded domain. Stage 39 implements 8-channel analysis to output, in parallel, 8 sub-band channels in response to the CQMF signal (CQMF channel 0) asserted to its input. Stage 41 implements 4-channel analysis to output, in parallel, four sub-band channels in response to the CQMF signal (CQMF channel 1) asserted to its input.

In order to increase the virtual bass effect for input audio with weak original bass (and also to attenuate bass content of input audio having very loud bass), the CQMF channel 0 signal (produced in stage 1 of FIG. 2) optionally undergoes dynamic range compression (e.g., in compressor 45 of FIG. 2). It should be appreciated that herein, the term dynamic range "compression" is used in a broad sense to denote either broadening of the dynamic range (sometimes referred to dynamic range expansion) or narrowing of the dynamic range, so that compressor 45 may be what is sometimes referred to as a compander (compressor/expander). A low pass filtered, down-mixed (mono) version of the CQMF channel 0 signal can be used as the control signal for the compressor. For example, stage 1 of the FIG. 2 system (or stage 1A of the FIG. 4 system, to be described below) can sum the lowest four sub-bands of the hybrid, sub-banded input data, and assert the control signal to compressor 45. In response to the control signal, compressor 45 (or element 1B of the FIG. 4 system, to be described below) performs an averaged energy calculation, and computes the compression gain required to perform the appropriate dynamic range compression.

As noted above, element 2 of FIG. 2 multiplies the output of compressor 45 (or the output of stage 1, if compressor 45 is omitted) by $e^{i\pi/8}$, and the output of element 2 undergoes windowing and zero-padding in oversampling stage 3. In a typical implementation of the FIG. 2 system, stage 3 performs the following operations on the complex-valued CQMF channel 0 samples asserted thereto (to implement frequency domain oversampling by a factor of 2):

1. stage 3 windows each 64 sample block of the CQMF data using a 64-point analysis window (the "stride" or "hop-size" with which the window is moved over the input signal (input of stage 3) in each iteration is denoted $p_a$ and is in a typical implementation $p_a$=4 sub-band samples); and 2. stage 32 then appends 32 zeros to each end of each block, resulting in a windowed, zero-padded block of 128 samples.

Then, a typical implementation of stage 5 performs a 128-point complex FFT on each windowed, zero-padded block. Elements 7, 9-11, 13-15, 17, 19, 21, 23, 25, and 27, then perform linear and non-linear processing (including harmonic transposition) on the FFT coefficients.

A 128-point IFFT could then be performed on each block of the resulting processed coefficients. However, in the implementation shown in FIG. 2, stage 19 splits (in a manner to be described in more detail below) each block of the processed coefficients into two half sized blocks (each comprising 64 coefficients): a first block indicative of content in the frequency range 0-375 Hz; and a second block indicative of content in the frequency range 375-750 Hz. After CQMF response compensation in elements 21 and 23, and phase shifting in elements 25 and 27, stage 29 performs a 64-point IFFT on each first block, and stage 31 performs a 64-point IFFT on each second block. Windowing and overlap/adding stage 33 discards the first and last 16 samples from each transformed block output from stage 29, windows the remaining 32 samples with a 32-point synthesis window, and overlap-adds the resulting samples, to generate a conventional CQMF channel 0 signal indicative of the transposed content in the range 0 to 375 Hz. Similarly, windowing and overlap/adding stage 35 discards the first and last 16 samples from each transformed block output from IFFT stage 31, windows the remaining 32 samples with a 32-point synthesis window, and overlap-adds the resulting samples (the "stride" or "hop-size" with which the half sized window performing the overlap-add operation is moved in each iteration is denotedp$_s$ and is in a typical implementation $p_s$=$p_a$), to generate a signal indicative of the transposed content in the range 375 to 750 Hz. Element 37 performs the above-described phase shift on this signal to generate a conventional CQMF channel 1 signal indicative of the transposed content in the range 375 to 750 Hz.

In typical implementations of the FIG. 2 system, the block size of the input to stage 3 is quite small (32-256 samples per block). The block size of the forward transform implemented by stage 5 is typically larger, and the specific forward transform block size depends on the frequency domain oversampling (typically a factor of 2, but sometimes a factor of 4).

In some implementations, the inventive system (e.g., the FIG. 2 embodiment) uses asymmetric analysis and synthesis windows for the forward (e.g., FFT) and inverse (e.g., IFFT) transforms in contrast to the symmetric windows used in typical implementations. The size (number of points) of the analysis window (e.g., the window applied in stage 3) and the forward transform (e.g., the transform applied by stage 5) may be different from that of the synthesis window (e.g., the window applied in stage 33 or 35) and the inverse transform (e.g., the inverse transform applied in stage 29 or 31). The shape and size of each window and size of each transform maybe chosen so as to achieve adequate frequency resolution while lowering the inherent algorithmic delay of the transposer.

In typical embodiments (e.g., the FIG. 2 embodiment, in which the input data are hybrid, sub-banded input data), computational complexity is reduced by processing only the signal of interest (e.g., the CQMF channel 0 data, generated in stage 1 of the FIG. 2 system in response to hybrid, sub-banded input data, are critically sampled).

More generally, in a class of embodiments, the inventive system comprises a preprocessing stage (e.g., summation stage 1 of the FIG. 2 system), coupled to receive input audio indicative of low frequency audio content (in a range from 0 to B Hz, so that B is the bandwidth of the low frequency audio content) and configured to generate critically sampled audio indicative of the low frequency audio content (e.g., the CQMF channel 0 signal output from stage 1 of FIG. 2); a bass enhancement stage (including a harmonic transposer) coupled and configured to generate a bass enhancement signal (e.g., the output of stages 39 and 41 of the FIG. 2 system)

in response to the critically sampled audio; and a bass enhanced audio generation stage (e.g., stage 43 of the FIG. 2 system) coupled and configured to generate to a bass enhanced audio signal (e.g., the output of stage 43 of FIG. 2) by combining (e.g., mixing) the bass enhancement signal and the input audio. In the FIG. 2 embodiment, the bass enhanced audio signal is a full frequency range signal generated by mixing the bass enhancement signal output from stages 39 and 41 of FIG. 2), and the input audio (sub-bands 0-7 of the hybrid sub-band signal) asserted to the summation stage, and also the other sub-bands (e.g., sub-bands 8-76) of the hybrid signal. The preprocessing stage (e.g., summation stage 1 of FIG. 2) is preferably configured to provide an at least substantially critically sampled signal to the bass enhancement stage. The at least substantially critically sampled signal is indicative of the low frequency audio content (in the range from 0 to B Hz), and has sampling frequency Fs/Q, where Fs is the sampling frequency of the input audio, and Q is a downsampling factor. Preferably, Q is the largest factor which makes Fs/Q at least substantially equal to (but not less than) two times the bandwidth B of the input signal (i.e., $Q \leq Fs/2B$). Transposed frequency components (produced in the bass enhancement stage) may have a sampling frequency of (Fs*S)/Q, where S is an integer. The downsampling factor Q preferably forces the output signal of the summation stage to be critically sampled or close to critically sampled.

The 2nd order "base" transposer (stage 9 of FIG. 2) of the inventive system extends the bandwidth of the input signal by a factor of two, thus generating harmonic components of $2^{nd}$ order, and transposers of other orders (e.g., stage 11 of FIG. 2) generate harmonics of greater factors. However, the frequency-transposed output of the inventive virtual bass system (and the output of elements 33 and 37 of the FIG. 2 system) typically does not need to include frequency components above about 500 Hz (otherwise, the audio signal frequency range to be transposed would extend above what is considered the bass range). The first CQMF channel (channel 0), whose bandwidth is from 0 to 375 Hz (at 48 kHz), has bandwidth which is typically more than adequate for the virtual bass synthesis system input. The first two CQMF channels (channel 0 and 1) have combined bandwidth (0 to 750 Hz at 48 kHz) that is typically sufficient for the virtual bass synthesis system output.

With reference again to the FIG. 2 embodiment, each complex coefficient output from transform stage 5 corresponds to a frequency identified by index k. Element 7 of FIG. 2 multiplies each complex coefficient by $e^{i\pi k}$. Stage 5 and element 7, considered together, are a subsystem (which may be referred to as a transform stage) which implements a single time-to-frequency domain transform. Element 7 is used to center the analysis window at time 0 in the FFT, an important step in a transposer (or phase vocoder).

Stage 9 of FIG. 2 is a 2nd order "base" transposer, which is coupled and configured to multiply the phase of each complex coefficient asserted thereto by transposition factor T=2, so as to double the phase of such coefficient.

Stage 11 of FIG. 2 is a fourth order transposer, which is configured to multiply the phase of each complex coefficient asserted thereto by transposition factor T=4, either directly or by interpolation of coefficients, so as to produce the fourth order harmonic of such coefficient.

The FIG. 2 system also includes a third order transposer (not shown in FIG. 2, but shown as stage 10 of FIG. 4), which operates in parallel with stages 9 and 11, and which is configured to multiply the phase of each complex coefficient asserted thereto by transposition factor T=3, either directly or by interpolation of coefficients, so as to produce the third order harmonic of such coefficient.

Optionally, the FIG. 2 system also includes transposers of other orders (e.g., fifth and optionally also higher orders), not shown in FIG. 2. Each of such optional transposers operates in parallel with stages 9 and 11, and multiplies the phase of each complex coefficient asserted thereto by a transposition factor T, where T is an integer greater than 4, either directly or by interpolation of coefficients, so as to produce a harmonic (or corresponding order) of such coefficient.

Thus, phase multiplier stages 9 and 11 (and each other phase multiplier stage, having a different transposition order, operating in parallel with stages 9 and 11) implement nonlinear processing which determines contributions to different frequency bands (e.g., different frequency bands of the enhanced low frequency audio output from stages 39 and 41) in response to one frequency band of the input low frequency audio to be enhanced (i.e., in response to a complex coefficient generated by transform stage 5 having a single frequency index k, or in response to complex coefficients generated by transform stage 5 having frequency indices, k, in a range). The interpolation scheme for transposition orders higher than 2 enables the use of a single, common time-to-frequency transform or analysis filter bank (including transform stage 5) and a single common frequency-to-time transform or synthesis filter bank (including inverse transform stages 29 and 31) for all orders of transposition, thereby significantly reducing the computational complexity when using multiple harmonic transposers.

The overall gains for the coefficients to which different transposition factors have been applied (by phase multiplier stages 9-11) are set independently (in stages 13-15). Gain stage 13 sets the gain of the coefficients output from stage 9, gain stage 15 sets the gain of the coefficients output from stage 11, and an additional gain stage (not shown in FIG. 2) for each other phase multiplier stage sets the gain of the coefficients output from the corresponding phase multiplier stage. One such additional gain stage is gain stage 14 of FIG. 4, which sets the gain of the coefficients output from stage 10 of FIG. 4. The coefficients output from the gain stages 13-15 are summed in element 17, generating a single stream of frequency-transposed (and level adjusted) coefficients which is indicative of the enhanced audio (virtual bass) determined in accordance with the invention. This single stream of frequency-transposed coefficients is asserted to the input of element 19.

As an example, the gains can be set to approximate the well-known Equal Loudness Contours (ELCs), since the ELCs can be adequately modeled by a straight line on a logarithmic scale for frequencies below 400 Hz. However, the odd order harmonics (the $3^{rd}$ order harmonic, $5^{th}$ order harmonic, etc.) can sometimes be perceived as being more harsh than the even order harmonics (the $2^{nd}$ order harmonic, $4^{th}$ order harmonic, etc.), although their presence is typically important (or vital) for the virtual bass effect. Hence, the odd order harmonics may be attenuated (in stages 13-15) by more than the amount determined by the ELCs. Additionally, each gain stage may apply (to one of the streams of transposed coefficients) a slope gain, i.e. a roll-off attenuation factor (e.g., measured in Decibels per octave). This attenuation is applied on a per bin basis (i.e., an attenuation value is applied independently for each frequency index, k). Moreover, in some implementations a control signal indicative of a tonality metric (indicated in FIG. 2, although this signal is not applied in some implementations) for CQMF channel 0 is asserted to the gain stages, and the gain stages apply gain on a per bin basis in response to the control signal. When there is a strong tonality, the slope gain may be applied (e.g., increased by 6 dB or some other amount per octave) so that the roll-off is steeper. This can improve the listening experience for audio (e.g., music) with bass (e.g., bass guitar) sounds consisting of strong harmonic series, which otherwise would result in an over-exaggerated virtual bass effect.

In some implementations, a control signal indicative of a tonality measure is asserted to the gain stages (e.g., stages 13-15), and the gain stages apply gain on a per bin basis in response to the control signal. In some such implementations, the tonality measure has been obtained by the conventional method used for CQMF subband samples in conventional HE-AAC audio encoding, where LPC coefficients are used to calculate the relation between the predictable part of the signal and the prediction error (the un-predictable part).

To adjust the virtual bass signal level, after the gains have been applied to the coefficients to which transposition factors have been applied (by phase multiplier stages 9-11), a control (correction) function is typically used. The control function may determine the gain, g(b), to be applied to the transposed data coefficients in a frequency sub-band (e.g., hybrid QMF sub-band) b, and may have the following form:

$$g(b)=H[(G\cdot nrg_{orig}(b)-nrg_{vb}(b))/(G\cdot nrg_{orig}(b)+nrg_{vb}(b))]+B,$$

where H, G and B are constants, and $nrg_{orig}(b)$ and $nrg_{vb}(b)$ are the energies (e.g., averaged energies) on a logarithmic scale of the original signal and the transposer output, respectively. In a typical implementation of the FIG. 2 system, this level compensation operation is performed in the hybrid sub-band domain in stage 43 of FIG. 2.

An example of such a control (correction) function (with H=0.5, G=1 and B=0.5) is the following per hybrid sub-band function of the energy of the transposed signal (Virtual Bass energy) and the energy of the original (pre-transposition) signal:

$$V(c,i,b)=[(nrg_{org}(c,i,b)-nrg_{vb}(c,i,b))/(nrg_{org}(c,i,b)+nrg_{vb}(c,i,b))]/2+½ \quad \text{(Eq. 5)},$$

in which $nrg_{org}(c,i,b)$ is the following function of $E_{org}(c,n,b)$, the energy of the original hybrid sub-band sample in channel c (i.e., the speaker channel corresponding to the input audio, for example, a left or right speaker channel), sub-band time slot n, and hybrid sub-band b:

$$nrg_{org}(c,i,b)=\log_{10}(\max(¼\cdot\Sigma_{n=4i\ to\ 4i+3}E_{org}(c,n,b),\epsilon)/\epsilon) \quad \text{(Eq. 6)},$$

where $\epsilon$ is a small positive constant, e.g. $10^{-5}$, and used to set a lower limit for the averaged energies.

In both Equation (5) and Equation (6), index i is the block index, i.e. the index of the blocks that are made up of subsequent hybrid sub-band samples over which the averaging is performed. In Equation (6), a block consists of 4 hybrid sub-band samples.

Figure 3:
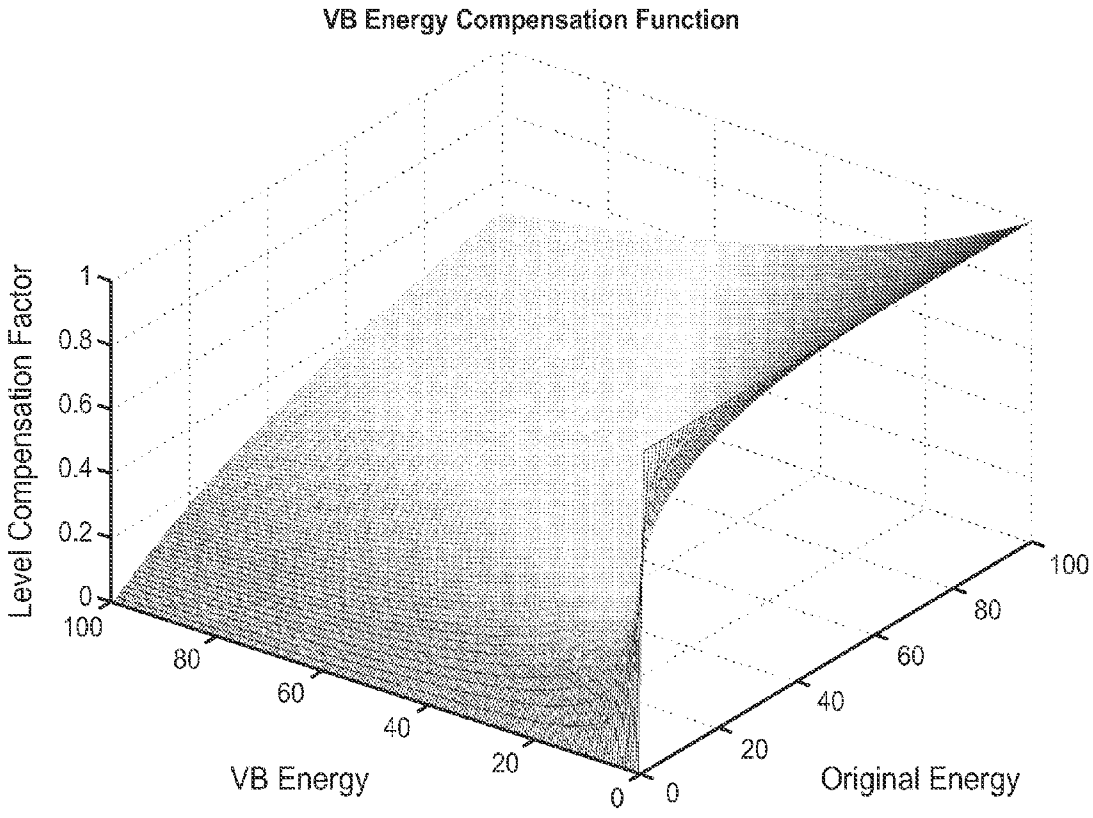
FIG. 3 is a graph of a control (correction) function which determines gains applied (e.g., by stage 43 in some implementations of the FIG. 2 system) to hybrid sub-bands (e.g., the output of stages 39-41 of some implementations of the FIG. 2 system) to which transposition factors have been applied in accordance with some embodiments of the invention.

In equation (5), the quantity $nrg_{vb}(c,i,b)$ is a function of energy, $E_{vb}(c,n,b)$, of the transposed signal contained in the hybrid sub-band sample in channel c, sub-band time slot n, and hybrid sub-band b, and is calculated in the way in which $nrg_{org}(c,i,b)$ is determined in equation (6), with $E_{vb}(c,n,b)$ replacing $E_{org}(c,n,b)$. The correction function of Eq. 5 is illustrated in FIG. 3, in which the value V(c,i,b) is plotted on the axis labeled "Level compensation factor," energy $E_{vb}(c,n,b)$ is plotted on the axis labeled "VB energy," and energy $E_{org}(c,n,b)$ is plotted on the axis labeled "Original energy."

In implementations in which the output of stage 1 is a CQMF channel 0 signal, the frequency-transposed data asserted from the output of element 17 of FIG. 2 is preferably transformed into a CQMF channel 0 signal and a CQMF channel 1 signal. This is implemented by elements 19, 21, 23, 25, 27, 29, 31, 33, and 35 of FIG. 2. Stage 19 is configured to split each block of frequency-transposed coefficients (typically comprising 128 coefficients) that is output from element 17 into two half sized blocks: a first half sized block (typically comprising 64 coefficients) indicative of content in the frequency range 0-375 Hz; and a second half sized block (typically comprising 64 coefficients) indicative of content in the frequency range 375-750 Hz.

In a typical embodiment, the splitting of coefficients is done as $$S_0(k)=S(k) \text{ for } 0\le k<⅜\cdot N; \text{ and}$$

$$S_0(k)=S(N/2+k) \text{ for } ⅜\cdot N\le k<N/2 \quad \text{(Eq. 7)},$$

for the first half sized block $S_0$, where S is the frequency coefficients of the full sized block prior to the splitting having N coefficients, and $$S_1(k)=S(N/2+k) \text{ for } 0\le k<N/8; \text{ and}$$

$$S_1(k)=S(k) \text{ for } N/8\le k<N/2 \quad \text{(Eq. 8)},$$

where $S_1$ is the second half sized block.

Stages 21 and 23 perform CQMF prototype filter frequency response compensation in the frequency domain. The CQMF response compensation performed in stage 21 changes the gains of the 0-375 Hz components output from stage 19 to match the normal profile produced in conventional processing of CQMF data, and the CQMF response compensation performed in stage 23 changes the gains of the 375-750 Hz components output from stage 19 to match the normal profile produced in conventional processing of CQMF data. More specifically, the CQMF compensations are applied to the frequency components indicative of the overlapping regions between CQMF channel 0 and CQMF channel 1 (e.g., for the frequency components of CQMF channel 0 indicative of the middle of the pass band and upwards in frequency, and for the frequency components of CQMF channel 1 indicative of the middle of the pass band and downwards in frequency). The levels of compensation are set to distribute the energy of the overlapping parts of the spectrum in a manner that a conventional CQMF analysis filter bank would do between CQMF channel 0 and CQMF channel 1 in the absence of the FFT splitting stage 19 of FIG. 2.

Following the above notations for $S_o$ and $S_i$, the compensation is done as $$S'_0(k)=G_0(k)\cdot S_0(k); \text{ and}$$

$$S'_0(k)=G_1(k)\cdot S_1(k) \text{ for } N/8\le k<⅜\cdot N \quad \text{(Eq. 9)},$$

where $S'_0$ and $S'_1$ are the frequency response compensated coefficients for the first and second half sized blocks respectively, and $G_0$ and $G_1$ are the absolute values of two half sized transforms (transform size N/2), which are indicative of the amplitude frequency spectrums of the convolutions of the impulse response of a first a filter (channel 0) of a 2-channel synthesis CQMF bank with the first two filters (channel 0 and channel 1) of a 4-channel analysis CQMF bank respectively.

Element 25 multiplies each complex coefficient output from stage 21 (and having frequency index k) by $e^{-i\pi k}$, to cancel the shift applied by element 7. Element 27 multiplies each complex coefficient output from stage 23 (and having frequency index k) by $e^{-i\pi k}$, to cancel the shift applied by element 7. Stage 29 performs a frequency-to-time domain transform (e.g., an IFFT, where stage 5 had performed an FFT) on each block of the coefficients output from element 25. Stage 31 performs a frequency-to-time domain transform (e.g., an IFFT, where stage 5 had performed an FFT) on each block of the coefficients output from element 27.

Windowing and overlap/adding stage 33 discards the first and last m samples (where m is typically equal to 16) from each transformed block output from inverse transform stage 29, windows the remaining samples, and overlap-adds the resulting samples, to generate a conventional CQMF channel 0 signal indicative of the transposed content in the range 0 to 375 Hz. Similarly, windowing and overlap/adding stage 35 discards the first and last m samples (where m is typically equal to 16) from each transformed block output from inverse transform stage 31, windows the remaining samples, and overlap-adds the resulting samples, to generate a signal indicative of the transposed content in the range 375 to 750 Hz. Element 37 performs the above-described phase shift on this signal to generate a conventional CQMF channel 1 signal indicative of the transposed content in the range 375 to 750 Hz.

As noted above, the output signals of elements 33 and 37 are filtered in Nyquist 8- and 4-channel analysis stages (stages 39 and 41 of FIG. 2) respectively to convert them back to the original hybrid sub-banded domain. Stage 39 implements 8-channel analysis to output, in parallel, 8 sub-band channels in response to the CQMF channel 0 signal asserted to its input. Stage 41 implements 4-channel analysis to output, in parallel, four sub-band channels in response to the CQMF channel 1 signal asserted to its input.

The outputs of stages 39 and 41 together comprise a bass enhancement signal (i.e., when mixed together, they determine the bass enhancement signal) which has been generated in the bass enhancement stage of the FIG. 2 system. The bass enhancement stage includes a harmonic transposer configured to apply transpositions having several transposition factors to low frequency content of input audio (i.e., to sub-bands 0-7 of the hybrid sub-banded input audio, whose content is in the range from 0 Hz to 375 Hz). The bass enhancement signal (including content in the range from 0 Hz to 750 Hz) is combined (e.g., mixed) with the input audio in bass enhanced audio generation stage 43 to generate a bass enhanced audio signal (the output of stage 43). The high frequency content (sub-bands 8-76) of the hybrid sub-banded input audio is also mixed with the bass enhancement signal in stage 43. Thus, the output of stage 43 is full range audio (the bass enhanced audio signal) which has been bass enhanced in accordance with an embodiment of the inventive virtual bass synthesis method.

Figure 4:
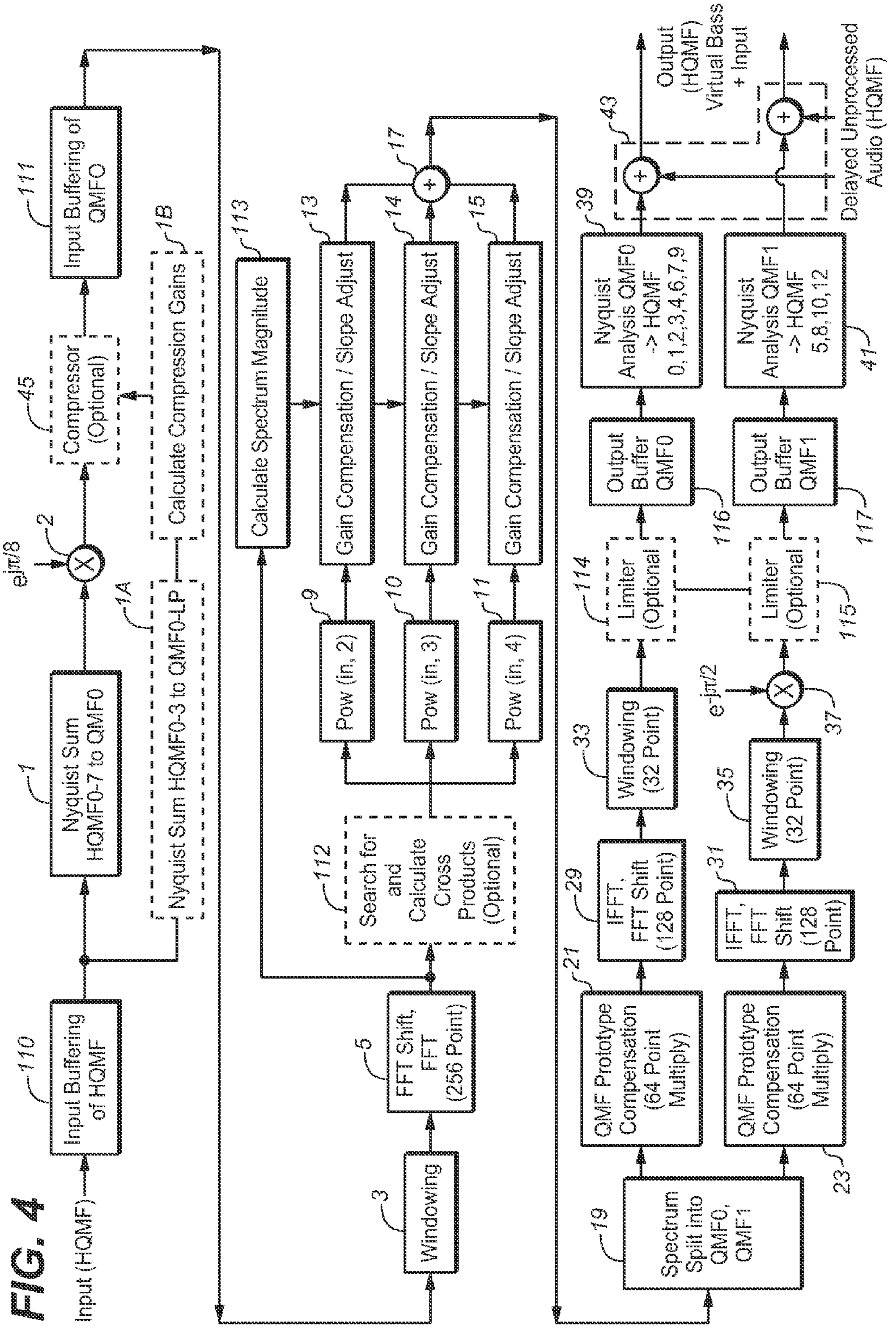
FIG. 4 is a block diagram of an implementation of the FIG. 2 system.

FIG. 4 is a block diagram of an implementation of the FIG. 2 system. Elements of the FIG. 4 implementation that are identical to corresponding elements of the FIG. 2 system are identically numbered in FIGS. 2 and 4, and the description of them above will not be repeated with reference to FIG. 4.

FIG. 4 includes input data buffer 110, which buffers the hybrid, sub-banded input audio data, whose sub-bands 0-7 are input to stage 1.

FIG. 4 also includes Nyquist synthesis stage 1A which is coupled to buffer 110 and configured to implement simple summation of the samples from the e.g. 4 lowest sub-bands (sub-bands 0-3) of the sub-banded input audio data in buffer 110, for each hybrid sub-band time slot. A stereo or a multi-channel signal would also be mixed down to a mono signal by the stage 1A. Hence, the output of stage 1A is indicative of a low-passed, mixed down for all input speaker channels, version of the CQMF sub-band signal of channel 0 (i.e., the output from stage 1). The output of stage 1A is employed by compression gain determination stage 1B to generate a control signal for compressor 45. In response to the output of stage 1A, stage 1B performs an averaged energy calculation, and computes the compression gain required to perform appropriate dynamic range compression on the corresponding segments of the output of stage 2. Stage 1B asserts (to compressor 45) the control signal to cause compressor 45 to perform such dynamic range compression.

The output of compressor 45 is buffered in buffer 111 (coupled between elements 45 and 3 as shown in FIG. 4), and then asserted to stage 3 for windowing and zero-padding.

In optionally included stage 112 (coupled between elements 5 and stages 9-11 as shown in FIG. 4, if included), the complex coefficients output from transform stage 5 are employed to calculate cross-products which can be used in some implementations of phase multiplication stages 9-11, as described in the paper by Lars Villemoes, Per Ekstrand, and Per Hedelin, entitled "Methods for Enhanced Harmonic Transposition," 2011 IEEE Workshop on Applications of Signal Processing to Audio and Acoustics, Oct. 16-19, 2011.

In optionally included element 113 (coupled between elements 5 and stages 13-15 as shown in FIG. 4, if included), the complex coefficients output from transform stage 5 are employed to determine spectrum magnitudes, which are in turn used to generate control signals which are asserted to stages 13-15 to control the gains (applied by stages 13-15) for the coefficients to which transposition factors have been applied by phase multiplier stages 9-11.

The FIG. 4 system also includes output buffer 116 (coupled between element 33 and stage 39 as shown in FIG. 4) for the CQMF channel 0 data output from element 33), and output buffer 117 (coupled between element 37 and stage 41 as shown in FIG. 4) for the CQMF channel 1 data output from element 37.

The FIG. 4 system optionally includes limiter 114 (coupled between element 33 and buffer 116 as shown in FIG. 4, if included), and limiter 115 (coupled between element 37 and buffer 117 as shown in FIG. 4, if included). Such limiters would function to limit the magnitudes of the transposed samples output from elements 33 and 37, e.g., to maintain averaged values of the magnitudes within predetermined limiting values.

In a class of embodiments, the invention is a virtual bass generation method, including steps of:

(a) performing harmonic transposition on low frequency components of an input audio signal (typically, bass frequency components expected to be inaudible during playback of the input audio signal using an expected speaker or speaker set) to generate transposed data indicative of harmonics (which are expected to be audible during playback, using the expected speaker(s), of an enhanced version of the input audio which includes the harmonics). An example of such transposed data is the output of stages 33 and 37 of FIG. 2;

(b) generating an enhancement signal in response to the transposed data (e.g., such that the enhancement signal is indicative of the harmonics or amplitude modified (e.g., scaled) versions of the harmonics). An example of such an enhancement signal is the time-domain output (comprising two sets of sub-bands of a hybrid, sub-banded signal) of stages 39 and 41 of FIG. 2; and (c) generating an enhanced audio signal by combining (e.g., mixing) the enhancement signal with the input audio signal. An example of such an enhanced audio signal is the output of element 43 of FIG. 2. Typically, the enhanced audio signal provides an increased perceived level of bass content during playback of the enhanced audio signal by one or more loudspeakers that cannot physically reproduce the low frequency components. Typically, combining the enhancement signal with the input audio signal aids the perception of low frequencies that are missing during playback of the enhanced audio signal (e.g., playback by small loudspeakers that cannot physically reproduce the missing low frequencies).

The harmonic transposition performed in step (a) employs combined transposition to generate harmonics, including a second order ("base") transposer and at least one higher order transposer (typically, a third order transposer and a fourth order transposer, and optionally also at least one transposer of order higher than four), of each of the low frequency components, such that all of the harmonics (and typically also the transposed data) are generated in response to frequency-domain values determined by a single, common time-to-frequency domain transform stage (e.g., by performing phase multiplication, either direct or by interpolation, on frequency coefficients resulting from a single time-to-frequency domain transform, for example, implemented by transform stage 5 and element 7 of the FIG. 2 embodiment) followed by a subsequent single, common frequency-to-time domain transform. Typically, the harmonic transposition is performed using integer transposition factors (e.g., the factors two, three, and four applied respectively by stages 9, 10, and 11 of FIG. 4), which eliminates the need for unstable (or inexact) phase estimation, phase unwrapping and/or phase locking techniques (e.g., as implemented in conventional phase vocoders).

Typically, step (a) is performed on low frequency components of the input audio signal which have been generated by performing a frequency domain oversampled transform on the input audio signal (e.g., frequency domain oversampling as implemented by stage 3 of FIG. 2), by means of generating windowed, zero-padded samples, and performing a time-to-frequency domain transform on the windowed, zero-padded samples. The frequency domain oversampling typically improves the quality of the virtual bass generation in response to impulse-like (transient) signals.

Typically, the method includes a step to generate critically sampled audio indicative of the low frequency components (e.g., as implemented by stage 1 of FIG. 2), and step (a) is performed on the critically sampled audio. In some embodiments, the input audio signal is a complex-valued QMF domain (CQMF) signal, and the critically sampled audio is indicative of a set of low frequency sub-bands (e.g., sub-bands 0-7) of the hybrid signal. Typically, the input audio signal is indicative of low frequency audio content (in a range from 0 to B Hz, where B is a number less than 500), and the critically sampled audio is an at least substantially critically sampled (critically sampled or close to critically sampled) signal indicative of the low frequency audio content, and has sampling frequency Fs/Q, where Fs is the sampling frequency of the input audio signal, and Q is a downsampling factor. Preferably, Q is the largest factor which makes Fs/Q at least substantially equal to (but not less than) two times the bandwidth B of the input signal (i.e., $Q \leq Fs/2B$).

In some embodiments (e.g., the method performed by the FIG. 2 system), step (a) is performed in a subsampled (downsampled) domain, which is the first (lowest frequency) band (channel 0) of a CQMF bank for the transposer analysis stage (input), and the first two (lowest frequency) bands (channels 0 and 1) of a CQMF bank for the transposer synthesis stage (output). In some such embodiments, the separation of CQMF channels 0 and 1 is accomplished by a splitting of the transposed data (e.g., as in element 19 of FIG. 2) into a first set of frequency components in a first frequency band (e.g., the frequency band of CQMF channel 0), and a second set of frequency components in a second frequency band (e.g., the frequency band of CQMF channel 1), and performing a relatively small size frequency-to-time domain transform on each of the first set of frequency components and the second set of frequency components (rather than a single, relatively large size transform on all of the transposed data, e.g., a relatively large transform having the same block size as the time-to-frequency domain transform performed to generate the frequency coefficients which undergo transposition). For example, each frequency-to-time domain transform (e.g., the transform implemented by stage 29 of FIG. 2 and the transform implemented by stage 31 of FIG. 2) has smaller block size (e.g., half the block size) than does the time-to-frequency domain transform (e.g., that implemented by stage 5 of FIG. 2) performed to generate the frequency coefficients which undergo transposition. Preferably, the first set of frequency components and the second set of frequency components are magnitude compensated to account for the CQMF channel 0 and CQMF channel 1 frequency responses.

In some embodiments, the transposed data are energy adjusted (e.g., attenuated), for example, as in elements 13-15 of FIG. 2. For example, the transposed data may be attenuated in a manner determined by the well-known Equal Loudness Contours (ELCs) or an approximation thereof. For another example, the transposed data indicative of each generated harmonic overtone spectrum may have an additional attenuation (e.g., a slope gain in dB per octave) applied thereto. The attenuation may depend on a tonality metric (e.g., for the frequency range of the low frequency components of the input audio signal), e.g., so that a strong tonality results in a larger attenuation (in dB per octave) within each generated harmonic overtone.

In some embodiments, data indicative of the harmonics are energy adjusted (e.g., attenuated) in accordance with a control function which determines a gain to be applied to each hybrid sub-band of the transposed data. The control function may determine the gain, g(b), to be applied to the transposed data coefficients in hybrid sub-band b, and may have the following form:

$$g(b)=H[G\cdot nrg_{orig}(b)-nrg_{vb}(b))/(G\cdot nrg_{orig}(b)+nrg_{vb}(b))]+B,$$

where H, G and B are constants, and $nrg_{orig}(b)$ and $nrg_{vb}(b)$ are the energies (e.g., averaged energies) in the corresponding hybrid sub-band of the input audio signal and the transposed data (or the enhancement signal generated in step (b)), respectively.

Figure 5:
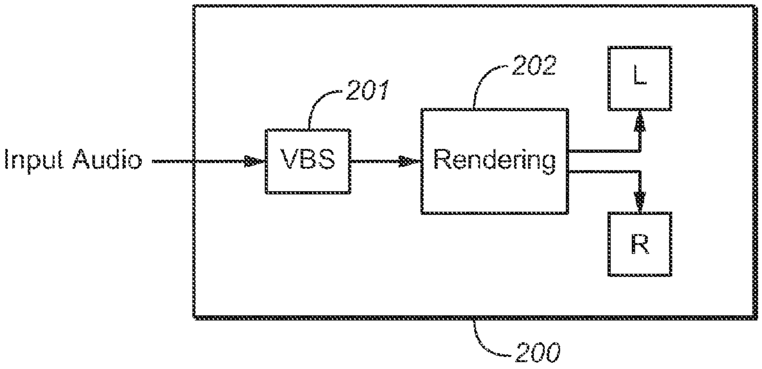
FIG. 5 is a block diagram of an embodiment of the inventive system (i.e., a device configured to generate enhanced audio in accordance with an embodiment of the inventive method, and to perform rendering and playback of the enhanced audio).

In some embodiments, the invention is a system or device (e.g., device having physically-limited or otherwise limited bass reproduction capabilities, such as, for example, a notebook, tablet, mobile phone, or other device with small speakers) configured to perform any embodiment of the inventive method on an input audio signal. Device 200 of FIG. 5 is an example of such a device. Device 200 includes a virtual bass synthesis subsystem 201, which is coupled to receive an input audio signal and configured to generate enhanced audio in response thereto in accordance with any embodiment of the inventive method, rendering subsystem 202, and left and right speakers (L and R), connected as shown. Subsystem 201 may (but need not) have the structure and functionality of the above-described FIG. 2 or FIG. 4 embodiment of the invention. Rendering subsystem 202 is configured to generate speaker feeds for speakers L and R in response to the enhanced audio signal generated in subsystem 201.

In typical embodiments, the inventive system is or includes a general or special purpose processor (e.g., an implementation of subsystem 201 of FIG. 5, or an implementation of FIG. 2 or FIG. 4) programmed with software (or firmware) and/or otherwise configured to perform an embodiment of the inventive method. In some embodiments, the inventive system is a general purpose processor, coupled to receive input audio data, and programmed (with appropriate software) to generate output audio data in response to the input audio data by performing an embodiment of the inventive method. In some embodiments, the inventive system is a digital signal processor (e.g., an implementation of subsystem 201 of FIG. 5, or an implementation of FIG. 2 or FIG. 4), coupled to receive input audio data, and configured (e.g., programmed) to generate output audio data in response to the input audio data by performing an embodiment of the inventive method.

While specific embodiments of the present invention and applications of the invention have been described herein, it will be apparent to those of ordinary skill in the art that many variations on the embodiments and applications described herein are possible without departing from the scope of the invention described and claimed herein. It should be understood that while certain forms of the invention have been shown and described, the invention is not to be limited to the specific embodiments described and shown or the specific methods described.

What is claimed is:

1. A virtual bass generation method, including a step of preprocessing samples of a sub-banded, CQMF (complex-valued quadrature mirror filter) input audio signal to generate critically sampled audio indicative of content of a set of low frequency sub-bands of the input audio signal, and including steps of:

(a) performing harmonic transposition on the critically sampled audio to generate transposed data indicative of harmonics, wherein the harmonics are expected to be audible during playback of an enhanced version of the input audio which includes said harmonics;

(b) generating an enhancement signal in response to the transposed data; and (c) generating an enhanced audio signal by combining the enhancement signal with the input audio signal, wherein the harmonic transposition performed in step (a) employs combined transposition such that the harmonics include a second order harmonic and at least one higher order harmonic of each of the low frequency components, and such that all of the harmonics are generated in response to frequency-domain values determined by a single, common time-to-frequency domain transform stage, and a subsequent inverse transform determined by a single, common frequency-to-time domain transform stage is performed.

2. The method of claim 1, wherein the input audio signal is indicative of low frequency audio content in a range from 0 to B Hz, where B is a number less than 500, and the critically sampled audio is an at least substantially critically sampled signal indicative of the low frequency audio content.

3. The method of claim 1, also including the step of generating the critically sampled audio by performing a frequency domain oversampled transform on the input audio signal, by generating windowed, zero-padded samples, and performing a time-to-frequency domain transform on the windowed, zero-padded samples to generate said critically sampled audio.

4. The method of claim 1, wherein the enhanced audio signal provides an increased perceived level of bass content during playback of said enhanced audio signal by at least one loudspeaker that cannot physically reproduce the low frequency components.

5. The method of claim 1, also including a step of playback of the enhanced audio signal by loudspeakers that cannot physically reproduce the low frequency components.

6. The method of claim 1, wherein the low frequency components of the input audio signal are bass frequency components expected to be inaudible during playback of the input audio signal using an expected speaker or speaker set.

7. The method of claim 1, wherein the transposed data are indicative of amplitude modified versions of said harmonics.

8. The method of claim 7, wherein the transposed data are amplitude modified versions of the harmonics whose values are determined at least approximately by Equal Loudness Contours (ELCs).

9. The method of claim 1, wherein step (a) includes a step of attenuating the harmonics in a manner determined by a tonality metric to determine the transposed data.

10. The method of claim 1, wherein at least one of steps (a) and (b) includes a step of attenuating data indicative of the harmonics in accordance with a control function, wherein the control function determines a gain to be applied to each frequency sub-band of the transposed data.

11. A virtual bass generation method, including a step of preprocessing samples of a sub-banded, CQMF (complex-valued quadrature mirror filter) input audio signal to generate critically sampled audio indicative of content of a set of low frequency sub-bands of the input audio signal, and including steps of:

(a) performing harmonic transposition on the critically sampled audio to generate transposed data indicative of harmonics, wherein the harmonics are expected to be audible during playback of an enhanced version of the input audio which includes said harmonics;

(b) generating an enhancement signal in response to the transposed data; and (c) generating an enhanced audio signal by combining the enhancement signal with the input audio signal, wherein the harmonic transposition performed in step (a) employs combined transposition such that the harmonics include a second order harmonic and at least one higher order harmonic of each of the low frequency components, and such that all of the harmonics are generated in response to frequency-domain values determined by a single, common time-to-frequency domain transform stage, and a subsequent inverse transform determined by a single, common frequency-to-time domain transform stage is performed, and wherein the critically sampled audio is a CQMF channel 0 signal, and the enhancement signal generated in step (b) includes a CQMF channel 0 enhancement signal and a CQMF channel 1 enhancement signal.

12. A virtual bass generation method, including steps of:

generating low frequency components of an input audio signal by performing a frequency domain oversampled transform on the input audio signal, by generating windowed, zero-padded samples, and performing a time-to-frequency domain transform on the windowed, zero-padded samples to generate said low frequency components;

(a) performing harmonic transposition on the low frequency components of the input audio signal to generate transposed data indicative of harmonics, wherein the harmonics are expected to be audible during playback of an enhanced version of the input audio which includes said harmonics;

(b) generating an enhancement signal in response to the transposed data; and (c) generating an enhanced audio signal by combining the enhancement signal with the input audio signal, wherein the harmonic transposition performed in step (a) employs combined transposition such that the harmonics include a second order harmonic and at least one higher order harmonic of each of the low frequency components, and such that all of the harmonics are generated in response to frequency-domain values determined by a single, common time-to-frequency domain transform stage, and a subsequent inverse transform determined by a single, common frequency-to-time domain transform stage is performed, and wherein step (b) includes a step of splitting processed frequency components into a first set of frequency components in a first frequency band and a second set of frequency components in a second frequency band, and performing a first frequency-to-time domain transform on the first set of frequency components and a second frequency-to-time domain transform on the second set of frequency components, wherein each of the first frequency-to-time domain transform and the second frequency-to-time domain transform has block size smaller than does the time-to-frequency domain transform.

13. The method of claim 12, wherein the first frequency band is the frequency band of CQMF channel 0, and the second frequency band is the frequency band of CQMF channel 1.

14. The method of claim 13, wherein the first set of frequency components and the second set of frequency components are magnitude compensated to account for CQMF channel 0 and CQMF channel 1 frequency responses, respectively.

15. A virtual bass generation method, including steps of:

(a) performing harmonic transposition on low frequency components of an input audio signal to generate transposed data indicative of harmonics, wherein the harmonics are expected to be audible during playback of an enhanced version of the input audio which includes said harmonics;

(b) generating an enhancement signal in response to the transposed data; and (c) generating an enhanced audio signal by combining the enhancement signal with the input audio signal, wherein the harmonic transposition performed in step (a) employs combined transposition such that the harmonics include a second order harmonic and at least one higher order harmonic of each of the low frequency components, and such that all of the harmonics are generated in response to frequency-domain values determined by a single, common time-to-frequency domain transform stage, and a subsequent inverse transform determined by a single, common frequency-to-time domain transform stage is performed, and wherein the time-to-frequency domain transform and the inverse transform use asymmetric analysis and synthesis windows.

16. A virtual bass generation method, including steps of:

(a) performing harmonic transposition on low frequency components of an input audio signal to generate transposed data indicative of harmonics, wherein the harmonics are expected to be audible during playback of an enhanced version of the input audio which includes said harmonics;

(b) generating an enhancement signal in response to the transposed data; and (c) generating an enhanced audio signal by combining the enhancement signal with the input audio signal, wherein the harmonic transposition performed in step (a) employs combined transposition such that the harmonics include a second order harmonic and at least one higher order harmonic of each of the low frequency components, and such that all of the harmonics are generated in response to frequency-domain values determined by a single, common time-to-frequency domain transform stage, and a subsequent inverse transform determined by a single, common frequency-to-time domain transform stage is performed, wherein at least one of steps (a) and (b) includes a step of attenuating data indicative of the harmonics in accordance with a control function, wherein the control function determines a gain to be applied to each frequency sub-band of the transposed data, and wherein the control function determines a gain, g(b), to be applied to harmonic coefficients in frequency sub-band b, and has form: $g(b)=H[(G\cdot nrg_{orig}(b)-nrg_{vb}(b))/(G\cdot nrg_{orig}(b)+nrg_{vb}(b))]+B$, where H, G and B are constants, $nrg_{orig}(b)$ is indicative of energy of the input audio signal in the sub-band b, and $nrg_{vb}(b)$ is indicative of energy of the transposed data or the enhancement signal in the sub-band b.

17. A virtual bass generation system, including:

a preprocessing stage coupled to receive an input audio signal, and configured to generate critically sampled audio indicative of low frequency components of the input audio signal;

a harmonic transposition stage coupled and configured to perform harmonic transposition on the critically sampled audio to generate transposed data indicative of harmonics, wherein the harmonics are expected to be audible during playback of an enhanced version of the input audio which includes said harmonics;

an enhancement signal generation stage coupled and configured to generate an enhancement signal in response to the transposed data; and an enhanced audio signal generation stage coupled and configured to generate an enhanced audio signal by combining the enhancement signal with the input audio signal, wherein the harmonic transposition stage includes a single time-to-frequency domain transform stage and a single frequency-to-time domain transform stage, and is configured to perform the harmonic transposition by employing combined transposition such that the harmonics include a second order harmonic and at least one higher order harmonic of each of the low frequency components, and all of the harmonics are generated in response to frequency-domain values determined by the time-to-frequency domain transform stage, wherein the input audio signal is a sub-banded, CQMF (complex-valued quadrature mirror filter) signal, and the critically sampled audio is indicative of content of a set of low frequency sub-bands of the CQMF signal.

18. The system of claim 17, wherein the input audio signal is indicative of low frequency audio content in a range from 0 to B Hz, where B is a number less than 500), and the critically sampled audio is an at least substantially critically sampled signal indicative of the low frequency audio content.

19. The system of claim 17, wherein the preprocessing stage is coupled and configured to perform frequency domain oversampling on the input audio signal, including by generating windowed, zero-padded samples, and performing a time-to-frequency domain transform stage on the windowed, zero-padded samples to generate said critically sampled audio.

20. The system of claim 17, wherein the enhanced audio signal provides an increased perceived level of bass content during playback of said enhanced audio signal by at least one loudspeaker that cannot physically reproduce the low frequency components.

21. The system of claim 17, also including:

a playback subsystem including at least one loudspeaker that cannot physically reproduce the low frequency components, wherein the playback subsystem is coupled and configured to generate at least one speaker feed for the at least one loudspeaker in response to the enhanced audio signal.

22. The system of claim 17, wherein the transposed data are indicative of amplitude modified versions of said harmonics.

23. The system of claim 22, wherein the transposed data are amplitude modified versions of the harmonics whose values are determined at least approximately by Equal Loudness Contours (ELCs).

24. The system of claim 17, wherein the harmonic transposition stage is configured to attenuate the harmonics in a manner determined by a tonality metric to determine the transposed data.

25. The system of claim 17, wherein at least one stage of said system is configured to attenuate data indicative of the harmonics in accordance with a control function, wherein the control function determines a gain to be applied to each frequency sub-band of the transposed data.

26. The system of claim 17, wherein said system is a processor programmed to implement the harmonic transposition stage, the enhancement signal generation stage, and the enhanced audio signal generation stage.

27. The system of claim 17, wherein said system includes a processor programmed to implement the harmonic transposition stage, the enhancement signal generation stage, and the enhanced audio signal generation stage.

28. The system of claim 17, wherein said system is a digital signal processor configured to implement the harmonic transposition stage, the enhancement signal generation stage, and the enhanced audio signal generation stage.

29. The system of claim 17, wherein said system includes a digital signal processor configured to implement the harmonic transposition stage, the enhancement signal generation stage, and the enhanced audio signal generation stage.

30. The system of claim 17, including a processing subsystem configured to implement the harmonic transposition stage, the enhancement signal generation stage, and the enhanced audio signal generation stage, and also including:

a playback subsystem including at least one loudspeaker that cannot physically reproduce the low frequency components, wherein the playback subsystem is coupled and configured to generate at least one speaker feed for the at least one loudspeaker in response to the enhanced audio signal.

31. A virtual bass generation system, including:

a harmonic transposition stage coupled and configured to perform harmonic transposition on low frequency components of an input audio signal to generate transposed data indicative of harmonics, wherein the harmonics are expected to be audible during playback of an enhanced version of the input audio which includes said harmonics;

an enhancement signal generation stage coupled and configured to generate an enhancement signal in response to the transposed data; and an enhanced audio signal generation stage coupled and configured to generate an enhanced audio signal by combining the enhancement signal with the input audio signal, wherein the harmonic transposition stage includes a single time-to-frequency domain transform stage and a single frequency-to-time domain transform stage, and is configured to perform the harmonic transposition by employing combined transposition such that the harmonics include a second order harmonic and at least one higher order harmonic of each of the low frequency components, and all of the harmonics are generated in response to frequency-domain values determined by the time-to-frequency domain transform stage, and wherein one of the harmonic transposition stage and the enhancement signal generation stage includes a frequency-to-time domain transform stage, and said time-to-frequency domain transform stage and said frequency-to-time domain transform stage use asymmetric analysis and synthesis windows.

32. A virtual bass generation system, including:

a harmonic transposition stage coupled and configured to perform harmonic transposition on low frequency components of an input audio signal to generate transposed data indicative of harmonics, wherein the harmonics are expected to be audible during playback of an enhanced version of the input audio which includes said harmonics;

an enhancement signal generation stage coupled and configured to generate an enhancement signal in response to the transposed data; and an enhanced audio signal generation stage coupled and configured to generate an enhanced audio signal by combining the enhancement signal with the input audio signal, wherein the harmonic transposition stage includes a single time-to-frequency domain transform stage and a single frequency-to-time domain transform stage, and is configured to perform the harmonic transposition by employing combined transposition such that the harmonics include a second order harmonic and at least one higher order harmonic of each of the low frequency components, and all of the harmonics are generated in response to frequency-domain values determined by the time-to-frequency domain transform stage, and wherein the low frequency components of the input audio signal are determined by a CQMF channel 0 signal, and the enhancement signal includes a CQMF channel 0 enhancement signal and CQMF channel 1 enhancement signal.

33. A virtual bass generation system, including:

a harmonic transposition stage coupled and configured to perform harmonic transposition on low frequency components of an input audio signal to generate transposed data indicative of harmonics, wherein the harmonics are expected to be audible during playback of an enhanced version of the input audio which includes said harmonics;

an enhancement signal generation stage coupled and configured to generate an enhancement signal in response to the transposed data;

an enhanced audio signal generation stage coupled and configured to generate an enhanced audio signal by combining the enhancement signal with the input audio signal; and a frequency domain oversampled transform stage, coupled and configured to perform frequency domain oversampling on the input audio signal, by generating windowed, zero-padded samples, and performing a time-to-frequency domain transform stage on the windowed, zero-padded samples to generate said low frequency components, wherein the harmonic transposition stage includes a single time-to-frequency domain transform stage and a single frequency-to-time domain transform stage, and is configured to perform the harmonic transposition by employing combined transposition such that the harmonics include a second order harmonic and at least one higher order harmonic of each of the low frequency components, and all of the harmonics are generated in response to frequency-domain values determined by the time-to-frequency domain transform stage, and wherein the enhancement signal generation stage is configured to split processed frequency components into a first set of frequency components in a first frequency band and a second set of frequency components in a second frequency band, and to perform a first frequency-to-time domain transform on the first set of frequency components and a second frequency-to-time domain transform on the second set of frequency components, wherein each of the first frequency-to-time domain transform and the second frequency-to-time domain transform has block size smaller than does the time-to-frequency domain transform.

34. The system of claim 33, wherein the first frequency band is the frequency band of CQMF channel 0, and the second frequency band is the frequency band of CQMF channel 1.

35. The system of claim 34, wherein the enhancement signal generation stage is configured to perform magnitude compensation on the first set of frequency components and the second set of frequency components to account for CQMF channel 0 and CQMF channel 1 frequency responses, respectively.

36. A virtual bass generation system, including:

a harmonic transposition stage coupled and configured to perform harmonic transposition on low frequency components of an input audio signal to generate transposed data indicative of harmonics, wherein the harmonics are expected to be audible during playback of an enhanced version of the input audio which includes said harmonics;

an enhancement signal generation stage coupled and configured to generate an enhancement signal in response to the transposed data; and an enhanced audio signal generation stage coupled and configured to generate an enhanced audio signal by combining the enhancement signal with the input audio signal, wherein the harmonic transposition stage includes a single time-to-frequency domain transform stage and a single frequency-to-time domain transform stage, and is configured to perform the harmonic transposition by employing combined transposition such that the harmonics include a second order harmonic and at least one higher order harmonic of each of the low frequency components, and all of the harmonics are generated in response to frequency-domain values determined by the time-to-frequency domain transform stage, wherein at least one stage of said system is configured to attenuate data indicative of the harmonics in accordance with a control function, wherein the control function determines a gain to be applied to each frequency sub-band of the transposed data, and wherein the control function determines a gain, g(b), to be applied to harmonic coefficients in frequency sub-band b, and has form:

$$g(b)=H[(G\cdot nrg_{orig}(b)-nrg_{vb}(b))/(G\cdot nrg_{orig}(b)+nrg_{vb}(b))]+B,$$

where H, G and B are constants, $nrg_{orig}(b)$ is indicative of energy of the input audio signal in the sub-band b, and $nrg_{vb}(b)$ is indicative of energy of the input audio signal in the sub-band b, and nrgVB(b) is indicative of energy of the transposed data or the enhancement signal in the sub-band b.

* * * * *